(12) United States Patent
Oda

(10) Patent No.: US 6,452,460 B2
(45) Date of Patent: Sep. 17, 2002

(54) SURFACE MOUNTING QUARTZ-CRYSTAL OSCILLATOR

(75) Inventor: Seiji Oda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/837,657

(22) Filed: Apr. 19, 2001

(30) Foreign Application Priority Data

Apr. 20, 2000 (JP) ........................................ 2000-119237

(51) Int. Cl.⁷ .............................. H03B 1/00; H03B 5/36; H01L 41/047; H01L 41/053; H01L 41/107
(52) U.S. Cl. ..................... 331/68; 331/108 D; 331/158; 310/318; 310/348; 310/365; 310/368
(58) Field of Search ........................ 331/68, 69, 108 D, 331/158, 187, 257; 257/678, 727; 310/314, 318, 348, 349, 365, 367, 368; 361/807, 820

(56) References Cited

U.S. PATENT DOCUMENTS 5,949,294 A * 9/1999 Kondo et al. .................. 331/68
6,246,013 B1 * 6/2001 Yoshida et al. ............. 174/260

* cited by examiner

*Primary Examiner*—David Mis
(74) *Attorney, Agent, or Firm*—Oblon, Spivak, McClelland, Maier & Neustadt, P.C.

(57) ABSTRACT

A surface mounting quartz-crystal oscillator having a container body formed with a recess of which a pair of opposite sidewalls are provided with steps, a quartz blank, an IC (integrated circuit) chip constituting an oscillating circuit including a quartz crystal member made of the quartz blank, and a cover closing the container body for sealing the quartz blank and the IC chip within the container body. At least one of the both ends of the quartz blank is bonded to the bottom face of the recess, and the opposite ends of the IC chip are held to the steps. A space is defined between the IC chip and the bottom face of the recess for permitting at least a part of the quartz blank to be disposed in the space.

8 Claims, 2 Drawing Sheets

SURFACE MOUNTING QUARTZ-CRYSTAL OSCILLATOR

BACKGROUND OF THE INVENTION

1. Field of the Invention

The present invention relates to a surface mounting quartz-crystal oscillator, which will be hereinbelow, referred to as a surface mounting oscillator, and more particularly, relates to a surface mounting oscillator having a superior productivity.

2. Description of the Prior Art

A quartz-crystal oscillator is formed as an oscillator unit in which a quartz-crystal element and an IC (an integrated circuit) chip which constitutes an oscillator circuit containing therein the quartz-crystal element are accommodated together in a common container. These type of quartz-crystal oscillators are widely used as frequency and time reference sources for many electronic appliances including telecommunication equipment. In the quartz-crystal oscillators, the surface mounting oscillator is usually adopted by small portable electronic appliances represented by, for example, cellular phones, and a demand for the surface mounting oscillator is expected to increase from now on. Thus, the surface mounting oscillator is requested particularly to have superior productivity, and additionally to reduce its height upon being mounted in order to enable the surface mounting oscillator to be mounted at a high mounting density.

FIGS. 1 and 2 are exploded perspective and cross-sectional views illustrating a conventional surface mounting oscillator, respectively.

The surface mounting oscillator of the prior art is provided with container body 1 made of laminated ceramics and accommodating therein quartz blank 2 and IC chip 3, and cover 6 attached to container body 1 to thereby hermetically encase quartz blank 2 and IC chip 3 within container body 1. Container body 1 is formed with recess 1a in which quartz blank 2 and IC chip 3 are received, and a couple of opposing sidewalls of the recess 1a provide a couple of steps 1b formed therein. IC chip 3 received in recess 1a has opposed ends held to bottom face 1c of recess 1a by the method of a face-down-bonding utilizing ultrasonic thermocompression bonding. Further, quartz blank 2 is held to one of steps 1b of recess 1a by conductive adhesive 7. Both ends of IC chip 3 are formed with a plurality of terminal electrodes (not shown) and bumps for conducting the ultrasonic thermocompression bonding. One of the longitudinal ends of quartz blank 2 is provided with laterally opposite sides in which extending electrodes 5 extending from excitation electrodes 4 are formed. Excitation electrodes 4 are arranged in both major surfaces of quartz blank 2. Extending electrodes 5 are fixedly bonded to the above-mentioned step 1b by electro-conductive adhesive 7 so that quartz blank 2 are held on step 1b. Cover 6 is attached and fixed to the container body 1 by, for example, seam-welding. In this case, metallic ring 8 for the purpose of welding is provided on the upper face of container body 1. The assignee of the present Patent Application has already disclosed in U.S. Ser. No. 09/651,023 and U.S. Ser. No. 09/651,026 an arrangement for surely connecting IC chip 3 of the surface mounting oscillator to the bottom face of the recess of the container body, and therefore the disclosure thereof will be hereby incorporated herein by reference.

Nevertheless, in the above-described arrangement of the surface mounting oscillator, IC chip 3 is firstly mounted to bottom face 1c of the recess of container body 1 and thereafter, quartz blank 2 is fixedly bonded to step 1b of the recess. Therefore, when it is found that after the bonding of quartz blank 2 acting as a quartz crystal element, the oscillating property thereof is inferior and not acceptable, high-priced IC chip 3 must be scrapped together with the quartz crystal element, resulting in such a problem that a reduction in productivity occurs which brings about an increase in the manufacturing cost of the surface mounting oscillator. At this stage, since the property of the quartz crystal element such as frequency-temperature characteristic is greatly affected by the holding or bonding condition of quartz blank 2, the property of the quartz crystal element cannot be evaluated until after quartz blank 2 is held by step 2. Further, when quartz blank 2 is bonded, conductive adhesive 7 is applied also to the upper face of quartz blank 2 for the purpose of increasing the bonding strength. This fact prevents the entire height of the surface mounting oscillator from being kept as small as possible.

SUMMARY OF THE INVENTION

An object of the present invention is therefore to provide a surface mounting oscillator having superior productivity.

Another object of the present invention is to provide a surface mounting oscillator having a height smaller than that of the prior art while enabling it to increase the mounting density thereof.

The above objects of the present invention will be achieved by a surface mounting quartz-crystal oscillator including a container body formed therein with a recess having a couple of opposite sidewalls in which steps are formed, a quartz blank, an IC (integrated circuit) chip constituting an oscillator circuit containing therein a quartz crystal element made of the quartz blank, and a cover for sealing the quartz crystal element and the IC chip within the container body, wherein one end of the quartz blank is bonded to a bottom face of the recess, opposite ends of the IC chip are fixedly held to the steps, and at least a part of the quartz blank is disposed in a space defined between the IC chip and the bottom face of the recess.

According to the described construction and arrangement, during the manufacturing of the surface mounting quartz-crystal oscillator, the IC chip can be mounted in the container body after the quartz blank is accommodated in the recess. Therefore, after the securing of the quartz blank but before the mounting of the IC chip, the property of the quartz crystal element can be examined to determine whether the quartz crystal element is good or bad. As a result, when the quartz crystal element is determined to be bad by the examination, the quartz crystal element may be cast aside so as to omit it from the succeeding manufacturing process. Accordingly, the high-priced IC chip can be prevented from being wasted while increasing the productivity of the surface mounting quartz-crystal oscillator.

DESCRIPTION OF THE PREFERRED EMBODIMENT

Figure 1:
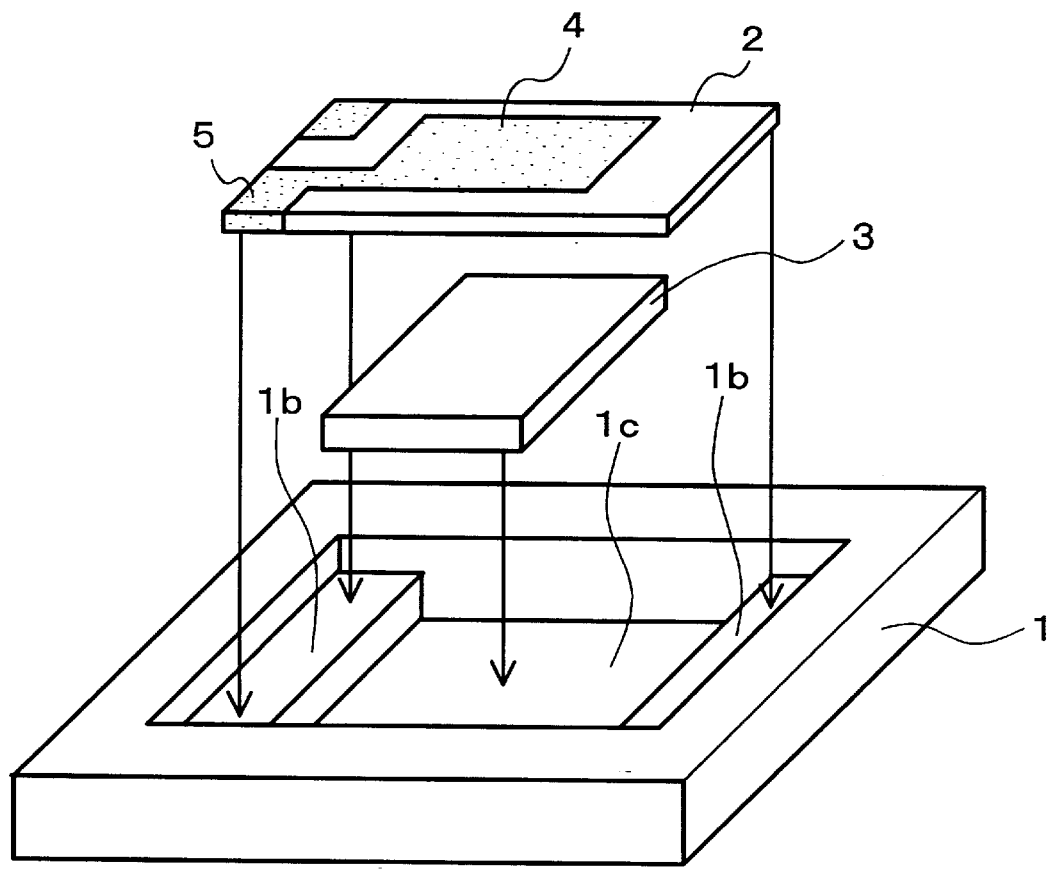
FIGS. 1 and 2 are exploded perspective and cross-sectional views illustrating a conventional surface mounting oscillator, respectively.
Figure 2:
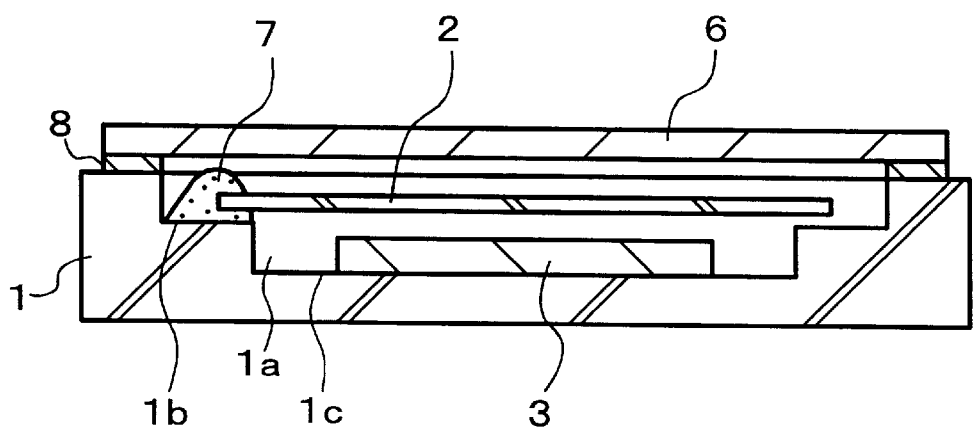
Figure 3:
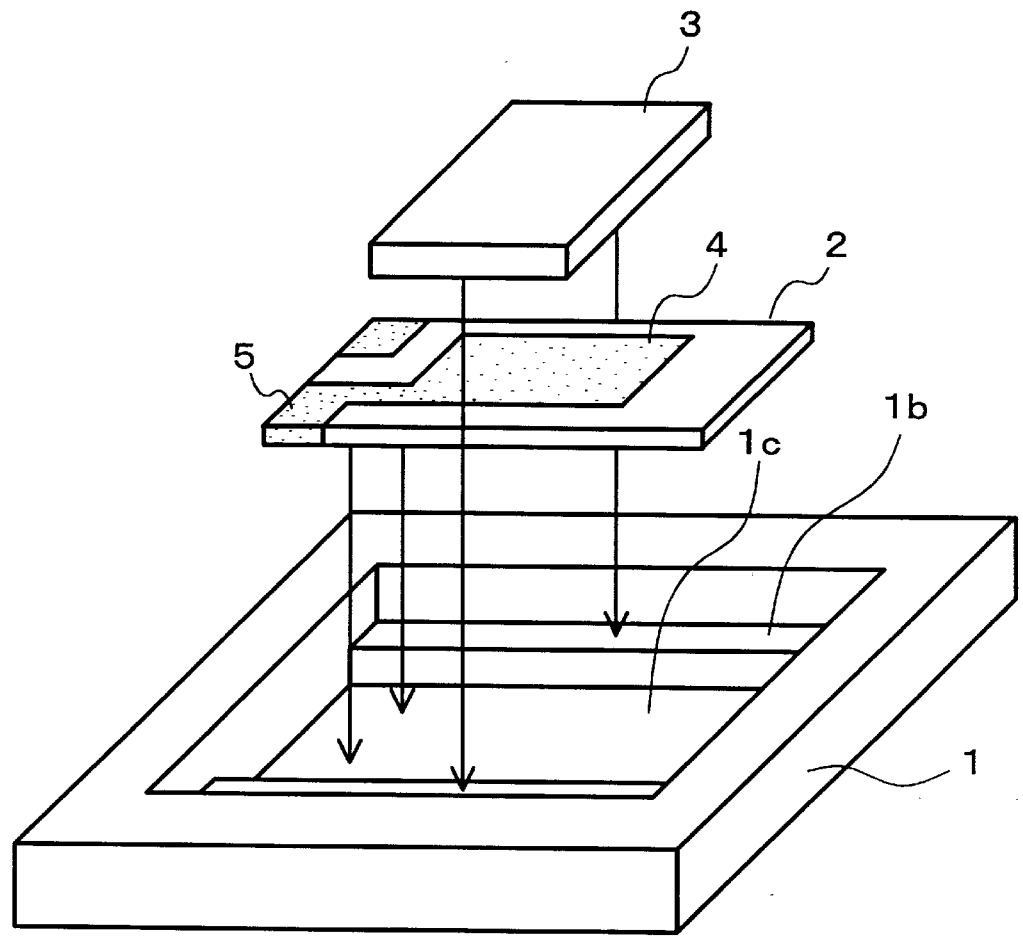
FIGS. 3 and 4 are exploded perspective and cross-sectional views illustrating a surface mounting oscillator according to a preferred embodiment of the present invention.
Figure 4:
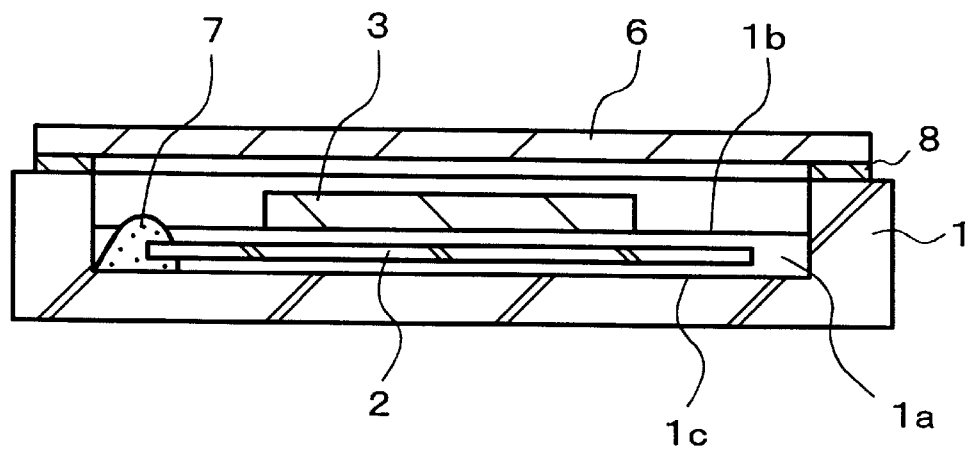

In FIGS. 3 and 4, which illustrate a surface mounting oscillator according to a preferred embodiment of the present invention, the same constituent elements as those of the prior art shown in FIGS. 1 and 2 will be designated by the same reference numerals and thus, any duplicate description thereof will be avoided hereinafter for the brevity sake.

Like the afore-described surface mounting oscillator of the prior art, the surface mounting oscillator of the present embodiment is provided with an arrangement in which quartz blank 2 and IC chip 3 are accommodated in container body 1 having therein a recess 1a and steps 1b. In the illustrated embodiment, recess 1a formed in container body 1 is substantially rectangular and is elongated in one direction. Recess 1a has sidewalls, which are positioned on opposite sides in a direction of the lateral width of recess 1a to form a couple of opposite steps 1b.

Quartz blank 2 is formed in a rectangular shape to have both faces in which excitation electrodes 4 are formed, respectively. Extending electrodes 5 formed to be extended from each of excitation electrodes 4 are disposed on opposite sides of one of the short sides of rectangular quartz blank 2. This quartz blank 2 is disposed in a bottom portion of recess 1a in such a way that the longitudinal direction of quartz blank 2 corresponds to the longitudinal direction of recess 1a. Namely, quartz blank 2 is arranged to confront bottom face 1c of the recess, so that the longitudinal direction of quartz blank 2 is in substantially line with the longitudinal direction of recess 1a, and so that the pair of extending electrodes 5 are fixedly bonded to bottom face 1a by conductive adhesive 7. Thus, quartz blank 2 is held to be parallel with bottom face 1c within recess 1a. At this stage, portions of quartz blank 2 except for extending electrodes 5 are held to be in no contact with bottom face 1c of recess 1a. Thus, the oscillation of quartz blank 2 cannot be prevented. It should be noted that the conductive adhesive 7 is applied to the upper face of quartz blank 2 at the position of extending electrodes 5.

IC chip 3 is formed in a substantially rectangular shape, and is arranged above quartz blank 2 while lying across or straddling it within recess 1a. IC chip 3 is held to be in no contact with quartz blank 2. IC chip 3 is held to steps 1b at its opposite ends by means of the afore-mentioned face-down-bonding method.

In connection with the longitudinal direction of recess 1a, the size of IC chip 3 is predetermined so as to be shorter than the length of recess 1a, and accordingly IC chip 3 is not disposed above the position of extending electrodes 5 of quartz blank 2, i.e., the position where conductive adhesive 7 is applied. Since the position of extending electrodes 5 is not covered by IC chip 3, conductive adhesive 7 can be applied to the securing position of quartz blank 2 until the height of conductive adhesive 7 becomes larger than that from bottom face 1c to steps 2.

It should be understood that although there is no illustration in the drawings, bottom face 1c of recess 1a is provided with electrodes formed at positions corresponding to extending electrodes 5. Further, the upper face of steps 1b of recess 1a is formed with electrodes at positions corresponding to the position of the bumps of IC chip 3. The electrodes of bottom face 1c and those of steps 1b are electrically connected to one another by non-illustrated conductive patterns to thereby establish electric connection between IC chip 3 and quartz blank 2. The outer surface of container body 1 is provided with mounting electrodes, which electrically connect the surface mounting oscillator with an external circuit board, and the mounting electrodes are electrically connected to the electrodes of steps 1b by conductive patterns piercing through container body 1.

When the above-described surface mounting oscillator is manufactured and assembled, quartz blank 2 is initially held to bottom face 1c of recess 1a of container body 1 by means of conductive adhesive 7. Subsequently, with respect to the quartz crystal element made of quartz blank 2, various characteristics of thereof such as the frequency-temperature characteristic are examined by measurement. As a result of the examination, if it is determined that the quartz crystal element is bad, the assembly of container body 1 and such bad quartz crystal element is omitted from the manufacturing process. The above process is repeatedly conducted to selectively acquire assemblies containing good quartz crystal elements therein. With respect to the assembly containing the good quartz crystal element, IC chip 3 is held to steps 1b of recess 1a by the face-down-bonding method. Then, cover 6 is attached to the container body 1 so as to seal the latter.

In accordance with the above-described manufacturing and assembling process, IC chip 3 is mounted in container body 1 after the examination of the quartz crystal element to determine whether or not the element is acceptable. Accordingly, the high-priced IC chip 3 is not wasted even if the quartz crystal element is bad and not acceptable, and therefore it is possible to increase the productivity of the surface mounting oscillator.

Further, according to adoption of the above-described arrangement of the surface mounting oscillator, IC chip 3 is not disposed above a region in which extending electrodes 5 of quartz blank 2 are formed, and therefore even if the conductive adhesive is applied to the upper face of extending electrodes 5, the applied conductive adhesive does not come into contact with the IC chip 3. Therefore, compared with the prior art surface mounting oscillator in which the quartz blank is held to the steps of the container body, the surface mounting oscillator of the present embodiment can surely reduce its entire height while maintaining sufficient holding strength of quartz blank 2. This fact means that although the surface mounting oscillator generally has its height larger than those of other circuit components mounted on a printed circuit board, the mounting density of the surface mounting oscillator can be increased by the adoption of the arrangement of the above-described embodiment, and as a result, it is possible to surely reduce the size of portable type electronic appliances.

In the above description of the preferred embodiment, quartz blank 2 is provided with extending electrodes 5, which are formed in laterally opposite sides of one of the short sides of the plate thereby enabling it to hold quartz blank 2 per se. However, the formation and disposition of extending electrodes 5 are not exclusively limited to the described embodiment. For example, the quartz blank may be provided with extending electrodes, which are disposed on respective of a pair of opposite sides of the blank thereby to fixedly hold the quartz blank in place. Further, cover 6 may be attached to the container body by other sealing methods such as epoxy resin sealing or glass sealing than the described seam welding. Then, it will be possible to omit the metallic ring. Moreover, application of conductive adhesive 7 to the upper face of the quartz blank will be needed no longer if sufficient holding strength of the quartz blank can be maintained.

From the foregoing description, it will be understood that many changes and variations will occur to those skilled in the art without departing from the scope and spirit of the invention as claimed in the accompanying claims.

What is claimed is:

1. A surface mounting quartz-crystal oscillator comprising:

a container body formed therein with a recess having a couple of opposite sidewalls in which steps are formed;

a quartz blank;

an IC (integrated circuit) chip constituting an oscillator circuit containing therein a quartz crystal element made of said quartz blank; and a cover for sealing said quartz crystal element and said IC chip within said container body, wherein at least one end of said quartz blank is bonded to a bottom face of said recess, both ends of said IC chip are held to said steps, and at least a part of said quartz blank is disposed in a space defined between said IC chip and said bottom face of said recess.

2. The oscillator as set forth in claim 1, wherein said quartz blank is provided with excitation electrodes formed in both major faces thereof, and a pair of extending electrodes extending from said excitation electrodes toward an outer periphery of said quartz blank, and wherein said pair of extending electrodes are bonded by conductive adhesive to said bottom face of said recess to thereby permit said quartz blank to be held in parallel with said bottom face of said recess within said recess.

3. The oscillator as set forth in claim 2, wherein said quartz blank is formed in a rectangular shape having a pair of short sides thereof, one of said short sides being provided, at both ends thereof, with said extending electrodes, and wherein said recess is formed in a rectangular shape having a longitudinal direction arranged to be in registration with a longitudinal direction of said quartz blank.

4. The oscillator as set forth in claim 2, wherein said conductive adhesive is further applied to an upper face of said quartz blank in a region in which said extending electrodes are formed.

5. The oscillator as set forth in claim 1, wherein said IC chip is rectangular in its shape and is held to said steps by the face-down-bonding.

6. The oscillator as set forth in claim 2, wherein said IC chip is rectangular in its shape and is held to said steps by the face-down-bonding in such a way that said IC chip is in no contact with said quartz blank while straddling said quartz blank.

7. The oscillator as set forth in claim 3, wherein said IC chip is rectangular in its shape and is held to said steps by the face-down-bonding in such a way that said IC chip straddles said quartz blank without being in contact with said quartz blank, and is arranged to be offset from a region in which said extending electrodes are formed.

8. The oscillator as set forth in claim 7, wherein said conductive adhesive is further applied to an upper face of said quartz blank in said region in which said extending electrodes are formed and, wherein a height from said bottom face of said recess to the top of said further applied conductive adhesive is larger than a height from said bottom face of said recess to said steps.

* * * * *